(12) United States Patent
Schneider et al.

(10) Patent No.: US 7,087,910 B2
(45) Date of Patent: Aug. 8, 2006

(54) METHOD FOR DETECTING AND COMPENSATING FOR POSITIONAL DISPLACEMENTS IN PHOTOLITHOGRAPHIC MASK UNITS AND APPARATUS FOR CARRYING OUT THE METHOD

(75) Inventors: Jens Schneider, München (DE); Tarek Lutz, München (DE)

(73) Assignee: Infineon Technologies AG, Munich (DE)

( * ) Notice: Subject to any disclaimer, the term of this patent is extended or adjusted under 35 U.S.C. 154(b) by 106 days.

(21) Appl. No.: 10/835,217

(22) Filed: Apr. 29, 2004

(65) Prior Publication Data

US 2004/0222386 A1   Nov. 11, 2004

(30) Foreign Application Priority Data

Apr. 29, 2003   (DE) .............................. 103 19 370

(51) Int. Cl.
*H01J 37/304*   (2006.01)
(52) U.S. Cl. .................... 250/491.1; 250/492.2
(58) Field of Classification Search ............ 250/491.1, 250/492.2
See application file for complete search history.

(56) References Cited

U.S. PATENT DOCUMENTS 6,107,207 A * 8/2000 Waas et al. ................ 438/707

FOREIGN PATENT DOCUMENTS

DE      198 18 440 A1   10/1999

OTHER PUBLICATIONS

Denise Puisto et al.: "Overlay enhancement with product-specific emulation in electron-beam lithography tools", *J. Vac. Sci. Technol.*, vol. B 12(6), Nov./Dec. 1994, pp. 3436-3439.
Min Bai et al.: "Transient measurement of resist charging during electron beam exposure", *J. Vac, Sci. Tchnol.*, vol. B 21(1), Jan./Feb. 2003, pp. 106-111.

* cited by examiner

*Primary Examiner*—Kiet T. Nguyen
(74) *Attorney, Agent, or Firm*—Laurence A. Greenberg; Werner H. Stemer; Ralph E. Locher

(57) ABSTRACT

A method for detecting and compensating for positional displacements of a photolithographic mask unit, includes providing mask production data for the writing of the mask unit with an electron beam. A structure density of the mask unit is input and an electron beam deflection is brought about on the mask unit in dependence on the determined structure density of the mask unit. The mask production data are corrected through the use of the determined electron beam deflection, in order to obtain corrected mask production data, and the corrected mask production data are output. A lithography apparatus for mask units with correction of positional displacements of the mask unit, is also provided.

10 Claims, 5 Drawing Sheets

METHOD FOR DETECTING AND COMPENSATING FOR POSITIONAL DISPLACEMENTS IN PHOTOLITHOGRAPHIC MASK UNITS AND APPARATUS FOR CARRYING OUT THE METHOD

BACKGROUND OF THE INVENTION

Field of the Invention

The present invention relates to a method for fabricating photolithographic mask units through the use of electron beam writers or through the use of electron beam writing units, and relates in particular to a method for detecting and compensating for positional displacements of a photolithographic mask unit, in which the mask unit is produced by electron beam writing. The invention also relates to an apparatus for carrying out the method.

In the fabrication of a photolithographic mask, which is referred to below as a mask unit, an ever higher accuracy is required as the integration density of the electronic circuit units increases.

In the fabrication of photolithographic mask units with the aid of electron beam writing units, physical effects such as e.g. electrical charging effects of the mask unit and of other components lead to a local deviation, i.e. to positional displacements in the positioning of structures due to an electrostatic deflection of the electron beam by the charged components.

Consequently, it is difficult to comply with the required specifications, which are referred to as registration, since a charging of resist films, by way of example, during an electron beam exposure entails a considerable pattern offset of up to 500 nm. Those electron beam image offset errors are generally referred to as registration and overlay errors, and become all the more important, the further the structural sizes of the circuit unit to be fabricated decrease.

A publication entitled "Overlay Enhancement with Product-Specific Emulation in Electron-Beam Lithography Tools", by Denise Puisto, Maris Sturans and Mark Lawliss, published in J. Vac. Sci. Technol. B 12(8), November/December 1994, describes electron beam image offset errors caused inter alia by charging effects.

A simple charging model is discussed and it is found that image offset errors in electron beam lithography are attributable both to internal and to external errors. It is ascertained that those errors cannot be corrected by traditional methods such as through the use of reference grids, for instance, which only take the system itself into account. The publication proposes, as an effective method for minimizing repetition image offset errors in electron beam lithography, a product-specific emulation which compensates for such errors by achieving mask operation corrections.

A publication entitled "Transient Measurement of Resist Charging During Electron Beam Exposure", by Min Bai, W. Dan Meisburger and R. Fabian W. Pease, published in J. Vac. Sci. Technol. B 21(1), January/February 2003, pages 106–111, describes resist film charging during electron beam exposure. It is ascertained that considerable errors of up to 500 nm can occur with regard to a pattern offset. In order to take into account or correct those errors, it is proposed to detect a secondary electron current with the aid of a special secondary electron collector while the mask unit to be fabricated is being exposed.

Such a secondary electron collector is capable of providing in-situ measurements of the surface potential on a resist film when the latter is irradiated with an electron beam. It is ascertained that electron beams of 10 to 25 keV cause substantially no charging on the resist film, having a thickness of up to 1 μm. If the thickness of the resist film reaches the maximum penetration depth of the electron beam, there is a considerable increase in the surface potential.

Surface potentials of greater than 50 V form only when substantially no electrons reach the conductive substrate. As a result of the investigations of that publication, it is found that a conductivity induced by an electron beam is a considerable factor in the charging process.

It is disadvantageous that although the known methods according to the prior art make it possible to ascertain or to measure the disadvantageous effects of the electron beam charging of substrates from which mask units are to be formed, they do not make it possible to also correct those measurable errors.

In order to improve fabrication accuracy of mask units, it has already been proposed to improve the corresponding mask writers. It is disadvantageous, however, that such improvements do not lead to a satisfactory result since different structure densities of the mask units lead to different charging effects in each case.

Furthermore, it has been proposed to reduce the electron dose during the electron beam writing of the mask units in order to improve a positional accuracy or registration accuracy during the writing of the mask units. However, the reduction in the electron dose during electron beam writing has the disadvantageous effect of lengthening an exposure time duration and/or impairing a penetration depth during the writing of mask units.

Additionally, methods have been proposed in the prior art for using a grid configuration which specifies displace-ment values of local displacements to prescribe for the electron beam writer, the electron beam writing unit, the local displacements which, for example, can correct a repeatedly occurring pattern of positional inaccuracies.

However, it is disadvantageous that, in the case of mask units with a high degree of variation in the local structure density, it is not possible to correct the variations governed by local charging effects. That is because the local variations governed by such local charging effects can only be corrected locally too, which consequently cannot be achieved in an expedient manner through the use of the methods mentioned above.

Therefore, it is a significant disadvantage of conventional methods that the charging effects of the mask unit to be created, which are governed by electron beam writing, cannot be adequately corrected.

SUMMARY OF THE INVENTION

It is accordingly an object of the invention to provide a method for detecting and compensating for positional displacements in photolithographic mask units and an apparatus for carrying out the method, which overcome the hereinafore-mentioned disadvantages of the heretofore-known methods and apparatuses of this general type and in which positioning errors of the writing electron beam can be determined and compensated for in a simple manner.

The basic concept of the invention lies in achieving a correction of the positioning inaccuracies by providing a previously created correction table of displacements in the plane of the mask unit due to expected charging effects. According to the invention, the effects are determined before an actual compensation and compiled in the correction table. It is subsequently possible to adapt a writing strategy of the electron beam writing unit.

One important advantage of the invention is that, for the compensation of electrostatic effects, it is possible to use a correction table which permits the determination of the positioning inaccuracies without having to fabricate a test mask unit for measuring the effects.

Furthermore, it is advantageous that the method according to the invention can be adapted for correcting all of the systematic errors or positioning inaccuracies.

With the foregoing and other objects in view there is provided, in accordance with the invention, a method for detecting and compensating for positional displacements of a photolithographic mask unit produced by electron beam writing. The method comprises providing mask production data for the writing of the mask unit with an electron beam. A structure density of the mask unit, which is prescribed by the mask unit to be created, is input. An electron beam deflection brought about on the mask unit in dependence on the structure density of the mask unit, is determined. A deflection model in accordance with a preferred embodiment of the present invention is advantageously used for determining the electron beam deflection. The mask production data is corrected with the determined electron beam deflection, to obtain corrected mask production data. The corrected mask production data is output.

Advantageous developments and improvements of the lithography apparatus according to the invention and the correction method are found in the dependent claims.

In accordance with another mode of the invention, the electron beam deflection is brought about by systematic effects and it is advantageously possible to compensate for the systematic effects.

In accordance with a further mode of the invention, the electron beam deflection is brought about by electrical potentials formed by the attachment of electrons at structures of the mask unit. The model simulation according to the invention advantageously specifies attachment effects of electrons at structures of the mask unit.

In accordance with an added mode of the invention, the electron beam deflection brought about by electrical potentials is determined through the use of a grid.

In accordance with an additional mode of the invention, the grid for determining the electron beam deflection is provided with a grid network size. The grid network size is advantageously selected to be smaller than the lateral range of the electron beam deflection. The electron beam deflection is expediently specified through the use of the physical formulae for electrostatic deflection.

In accordance with yet another mode of the invention, the electrical potentials formed by the attachment of electrons at structures of the mask unit are determined through the use of a convolution.

In accordance with yet a further mode of the invention, the determination of the electron beam deflection through the use of a grid is provided on the basis of Newton's equations of motion.

In accordance with yet an added mode of the invention, the corrected mask production data are combined in the form of a correction table and provided for further processing.

With the objects of the invention in view, there is also provided a lithography apparatus for mask units permitting correction of positional displacements of a mask unit. The apparatus comprises an electron beam device for outputting an electron beam. A mask data production device provides mask production data corresponding to a mask unit to be produced. An electron beam writing unit writes a mask unit with the electron beam in dependence on the mask production data provided. A determining device determines an electron beam deflection brought about on the mask unit, in dependence on a structure density of the mask unit. A correction device corrects the mask production data with the determined electron beam deflection, to obtain corrected mask production data. An outputting device outputs the corrected mask production data.

In accordance with another feature of the invention, the electron beam writing unit has a control unit for controlling the electron beam in dependence on the corrected mask production data.

In accordance with a concomitant feature of the invention, the lithography apparatus for mask units is provided for use with ion beams.

In this way, it is possible to apply the method for detecting and compensating for positional displacements in photolithographic mask units and the lithography apparatus to ion beam writing. For this purpose, in the exemplary embodiment described below, a negative electron charge has to be replaced by a corresponding positive (or negative) ion charge.

Other features which are considered as characteristic for the invention are set forth in the appended claims.

Although the invention is illustrated and described herein as embodied in a method for detecting and compensating for positional displacements in photolithographic mask units and an apparatus for carrying out the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Before referring in detail to the figures of the drawings, in which identical reference symbols designate identical or functionally identical components or steps, for illustrating the method for detecting and compensating for positional displacements of photolithographic mask units, with reference to the flow diagram of FIG. 1, the occurrence of charging effects and the production of correction tables will be described in more detail below.

A charging of a photolithographic mask unit by a charge deposition is effected on the basis of a charge density prevailing on the mask unit at the coordinates x, y, z in accordance with equation (1):

$$\rho(x,y,z) = m \cdot p(x,y) \cdot f(z) \tag{1}$$

In this case, p designates a structure or pattern density of the pattern to be applied to the photolithographic mask unit, ρ designates a charge density and f(z) designates a depth profile in the z direction.

Figure 2:
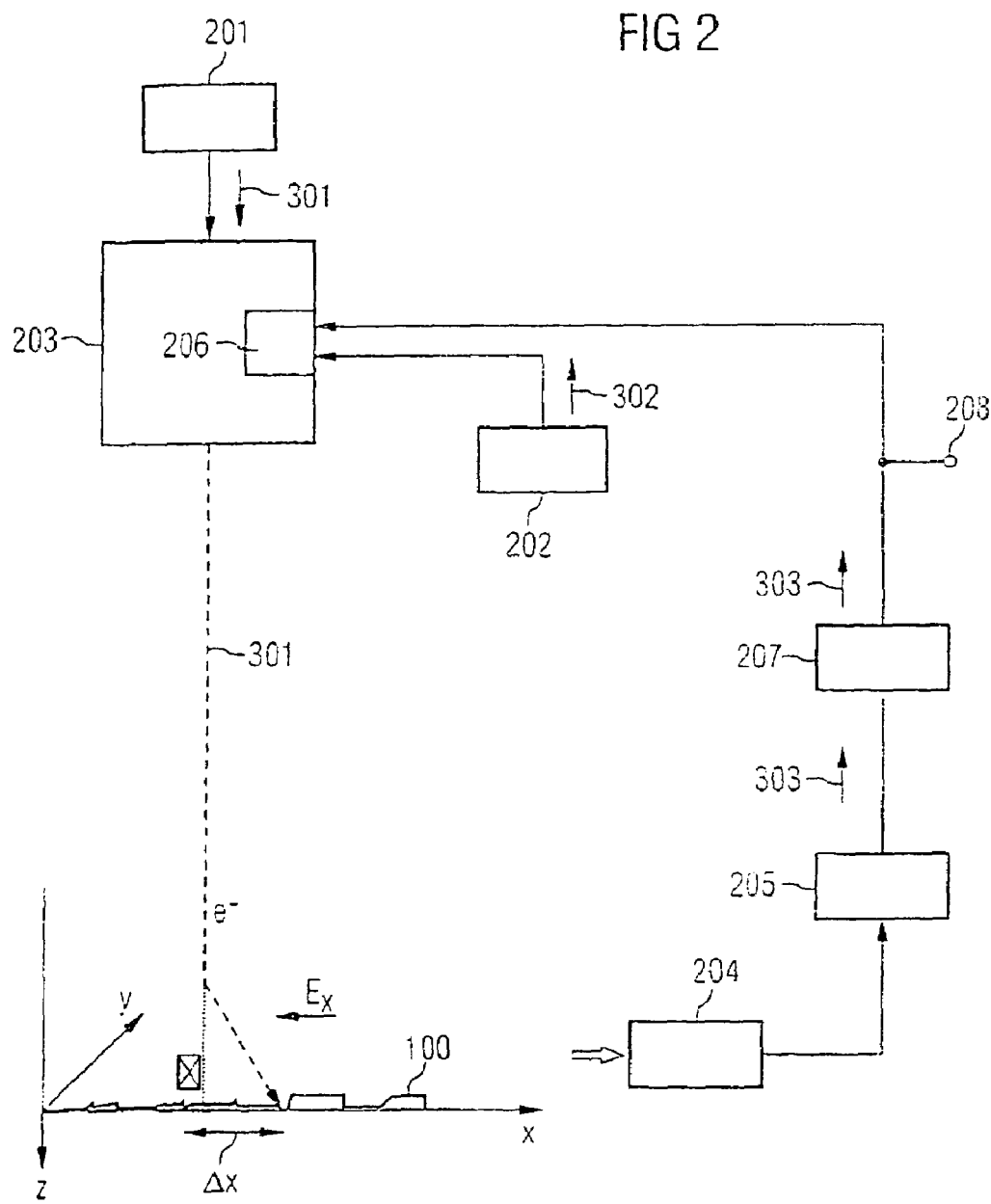
FIG. 2 is a block diagram illustrating the construction and the functioning of a lithography apparatus for mask units in accordance with a preferred exemplary embodiment of the present invention.

A constant factor m takes into account further geometrical parameters of the configuration of the lithography apparatus according to the invention as shown in FIG. 2.

In order to determine the electrostatic potential relevant to the electron beam (or ion beam) deflection, use is made of Poisson's equation for the field distribution, which can be solved with the aid of Green's function g, in accordance with the following equation (2):

$$\Delta\Psi = \frac{1}{\varepsilon_0 \varepsilon_r} \rho(x, y, z) \tag{2}$$

$$\Psi(\vec{r}) = \int d^3 r' \rho(\vec{r}') g(|\vec{r} - \vec{r}'|)$$

In this case, $\varepsilon_r$ designates the relative permittivity and $\varepsilon_0$ designates the permittivity of free space. The deflection is effected by the electric field in accordance with equation (3):

$$\vec{E} = -\vec{\nabla}\Psi \tag{3}$$

FIG. 2 illustrates by way of example how an electron beam is deflected by the electric field. In this case, it shall be assumed that the electron beam moves in the +z direction and a deflection is effected in the x,y plane.

The course of the electron beam is represented by a dashed line e⁻ in FIG. 2. If a deflection in the x direction is assumed, then there results with the equilibrium of forces in accordance with equation (4):

$$m\ddot{x} = qE_x \tag{4}$$

and equation (5):

$$x(t) = x_0 + v_{x0}t + \frac{1}{2}\frac{q}{m}t^2 E_x \tag{5}$$

In this case, q designates the electron charge, m designates the electron mass and t represents the time of flight.

If it is assumed that the initial velocity of the electron is 0, i.e. $v_{x0} = 0$ the expression in accordance with equation (6) below results as a displacement in the x direction.

It should be pointed out that a displacement in the y direction can be determined in an analogous manner using the above equations.

$$\Delta x = s_x = \frac{1}{2}\frac{q}{m}t^2 E_x \tag{6}$$

The variable $s_x$ designates the displacement, i.e. the positional displacement in the x direction, so that the following equation (7) generally results as an offset model (displacement model):

$$s_{x,y} = -\frac{1}{2}\frac{q}{m}t^2 \frac{\partial}{\partial x, y}\Psi, \tag{7}$$

with equation (3) having been used for the representation of equation (7).

In order to correctly determine the electron beam deflection as a consequence of a charge deposition at the location of the mask unit to be fabricated, it is subsequently necessary to specify a pattern or structure density dependence to the form of the electrostatic potential in accordance with equation (8), with Green's function $g_{z0}$ being averaged at $z_0$ and being convolved with the charge density p in accordance with the equation (1).

The "average" depth $z_0$ thus makes it possible to carry out only a two-dimensional determination in the (x,y) plane without taking the z coordinate into account.

$$\Psi(x,y) = mf(z_0)p(x,y) \otimes g_{z0} \tag{8}$$

In this case, the symbol ⊗ designates a convolution operation. Consequently, it is possible to obtain the displacements of mask structures $s_{x,y}$ proportionally to the derivative of the convolved structure density p.

The effect of Green's function will be explained in more detail below. Without further boundary conditions such as may be given, for example, by an external voltage or the like, the following holds true for Green's function in accordance with Coulomb approximation equation (9):

$$g_E(\vec{r}) = -\frac{1}{\varepsilon_0 \varepsilon_r}\frac{1}{r}, \tag{9}$$

with shielding effects or the like not being described in any more specific detail. In order to improve the description of the effect of Green's function, use may be made of equation (10) below:

$$g_y(\vec{r}) \sim \frac{e^{-r/\delta}}{r}, \tag{10}$$

which contains a further parameter, namely the shielding range δ.

The potential $\overline{E}$ may be described to an approximation as having arisen from a charge distribution in accordance with equation (10a):

$$\rho(x,y,z) = \rho(x,y) \cdot \delta(z-z_0) \tag{10a}$$

In this case, use is made of a Green's function in accordance with equation (11):

$$g_{z_0}(x,y) = g(x,y,z_0) \quad (11)$$

where $r = (x^2+y^2+z^2)^{1/2}$ in which there follows after an approximation with a Gaussian function in accordance with equation (12):

$$g_{G,\delta}(x,y) = \frac{1}{\pi\delta^2}\exp\left[-\left(\frac{x^2+y^2}{\delta^2}\right)\right]. \quad (12)$$

The approximation in accordance with equation (12) affords considerable advantages in the determination of Green's function. The preliminary factors from equations (7), (8) and (12) are combined in a single constant $\alpha$, so that equation (13) holds true for the displacements $s_{x,y}$:

$$s_{x,y} = \alpha \frac{\partial}{\partial x, y}\tilde{p}(x,y), \quad (13)$$

with the so-called pseudo-structure density $\tilde{p}(x,y)$ being described by the following equation (14):

$$\tilde{p}(x,y) = p(x,y) \otimes g_{G,\delta}(x,y) \quad (14)$$

Consequently, only the two constants $\alpha$ and $\delta$ are used for determining the displacement $s_{x,y}$, where $\alpha$ designates the intensity of the charging effects, while $\delta$ designates the range of the charging effects.

In this way, in accordance with the preferred exemplary embodiment of the present invention, the advantage is afforded that charging effects which lead to mask errors due to an electron beam deflection can be detected and compensated for in a simple manner.

Finally, a temporal development of the charging pattern is examined below since the mask structure density p is not formed completely from the outset in the case of electron beam writing, but rather is formed gradually precisely by the electron beam writing.

In other words, in the case of the electron beam writing, the field $\Psi$ and thus the pseudo-structure density $\tilde{p}(x,y)$ in accordance with equation (14) develops step by step.

Figure 3:
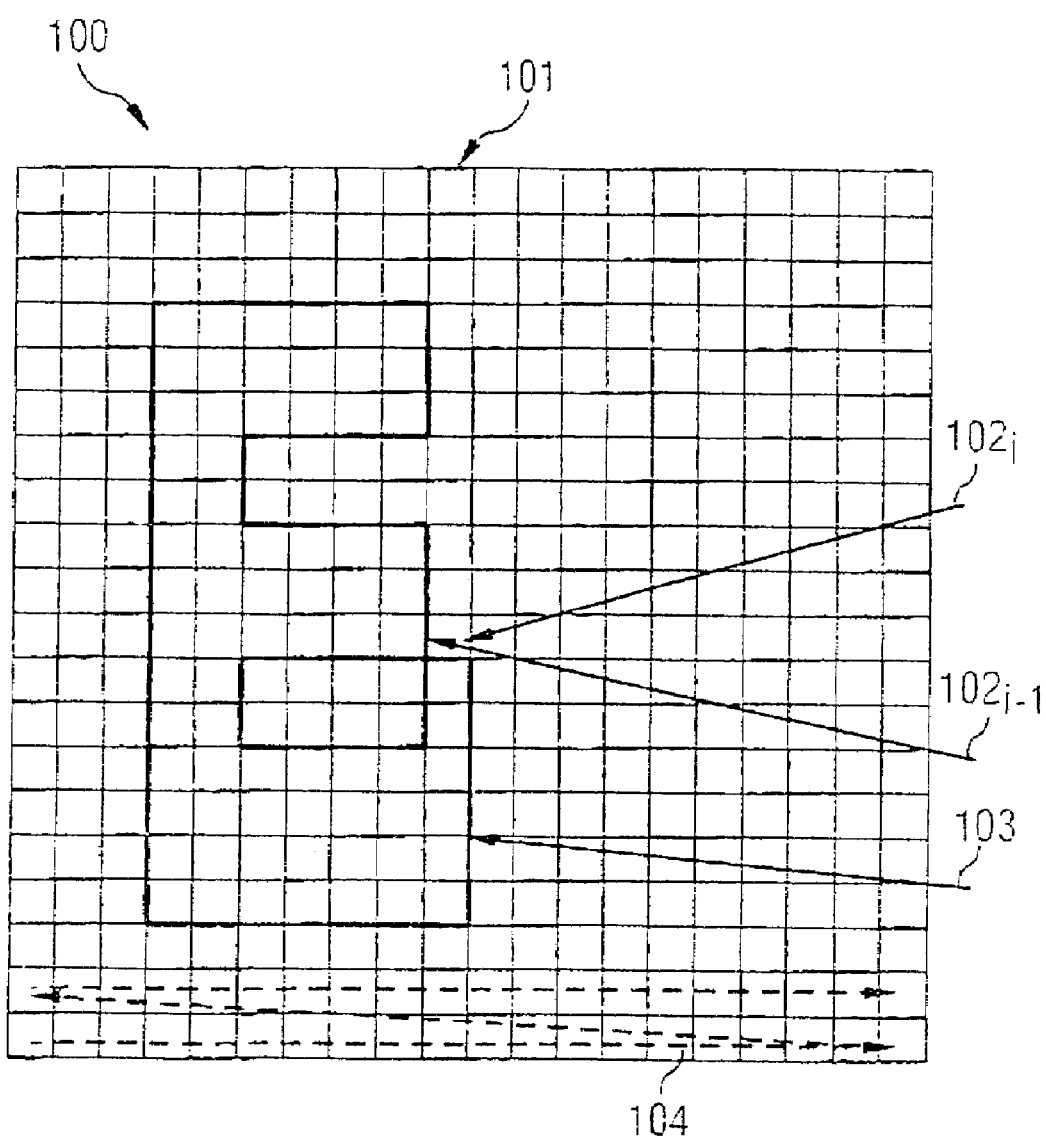
FIG. 3 is a diagrammatic illustration of an example of a mask unit, subdivided into a grid with grid network parts, in accordance with a preferred exemplary embodiment of the present invention.

Consequently, the positional displacements $s_{x,y}$ depend on the electron beam writing strategy or the history in the case of the electron beam writing. In order to take these effects into account, the method according to the invention for detecting and compensating for positional displacements provides grids having a prescribed grid network size. A grid 101, which is composed of written grid network parts 103 and non-written grid network parts 102, as discussed below and illustrated in FIG. 3, is provided in the region of the mask pattern.

The grid network size of the grid 101, or the grid network parts 102, 103 or patches, are preferably chosen in such a way that the grid network size is smaller than the range of the charging effects $\delta$ introduced with reference to equation (12).

Positional displacements $s_{x,y}$ in a pattern i are determined from the field in accordance with equation (15) for the grids j=1, . . . , i−1:

$$\tilde{p}^{(i)} = p^{(i)} \otimes g_G \quad (15)$$

where $$p^{(i)}(x,y) = \begin{cases} p(x,y) & x,y \text{ in grid part no. (patch no.)} 1, \ldots, i-1 \\ 0 & \text{otherwise} \end{cases}$$

This results in the modified positional displacement in accordance with the equation (16) below:

$$s_{x,y}^{(i)} = \alpha\frac{\partial}{\partial x, y}\tilde{p}^{(i)} \quad (16)$$

With the aid of equation (16) above, it is now possible to specify a correction table in order to compensate for the positional displacements $s_{x,y}$ that have resulted from the charging effects. For this purpose, a correction table is created with entries for each grid network part (patch).

In this case, the grid network parts should preferably be set to 30% or less of the range $\delta$ of the charging effects.

Consequently, it becomes possible in an advantageous manner to represent a grid network part with the same displacement value and to correct it correspondingly. The correction function, i.e. a correction table then results from equation (17) below:

$$m_{x,y}^{(i)} = -s_{x,y}^{(i)}(x^{(i)}, y^{(i)}) \quad (17)$$

where $x^{(i)}$, $y^{(i)}$=center of the grid network part 102 or patch center.

The correction tables according to the invention can now be used in accordance with equation (17):
(i) to provide a direct positional correction for the electron beam writing unit in the case of electron beam writing, as will be described below with reference to FIG. 4; or
(ii) to use the correction data of the correction table for the correction of the design data during data conditioning for the mask production data, as will be described below with reference to FIG. 5.

Figure 1:
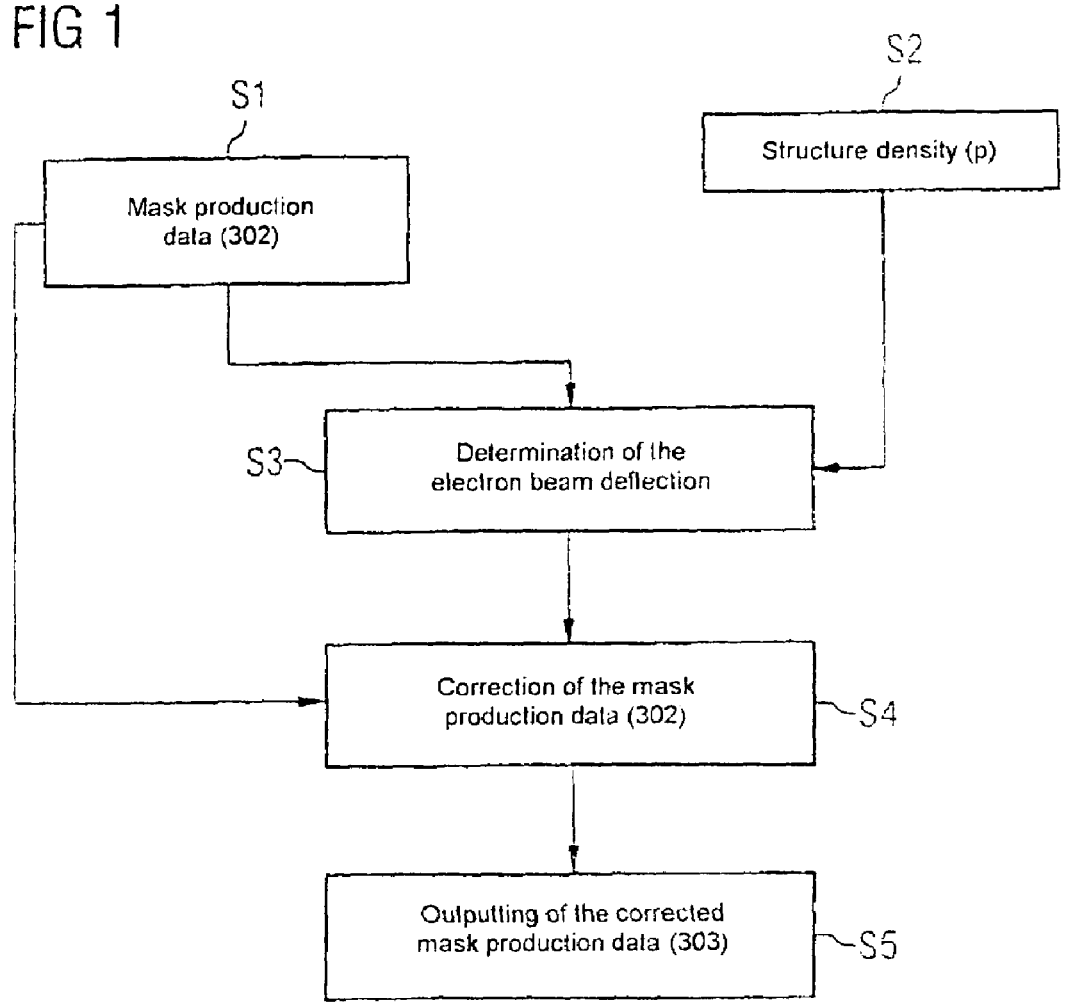
FIG. 1 is a flow diagram for illustrating the method for detecting and compensating for positional displacements in photolithographic mask units in accordance with a preferred exemplary embodiment of the present invention.

FIG. 1 illustrates a flow diagram for elucidating a method for detecting and compensating for positional displacements $s_{x,y}$ of a photolithographic mask unit 100. The mask unit 100, which is seen in FIGS. 2 and 3, is produced by electron beam writing, in accordance with a preferred exemplary embodiment of the present invention.

In a step S1, mask production data 302 are provided in order to be able to write the mask unit 100 through the use of an electron beam. An electron beam deflection brought about on the mask unit 100 in dependence on the structure density p of the mask unit 100 is determined in accordance with a structure density p, which is determined in dependence on the mask unit 100 to be created and is provided in a step S2.

After the electron beam deflection has been determined in a step S3, the mask production data 302 are corrected through the use of the electron beam deflection that is determined. This is done in order to obtain corrected mask production data 303, in a step S4, as is also seen in FIG. 2.

Finally, the corrected mask production data 303 are output in a step S5 and are available for further processing.

That further processing may reside, on one hand, in directly inputting positional correction values (a map) in the case of an electron beam writing unit, and for providing correction data for correction of design data during data conditioning. The positional correction values or the correction table which provide the corrected mask production data can be obtained by using the above-mentioned equations (1) to (17), as described above. The determination of local charging effects is corrected, according to the invention, through the use of a local variation of the electron beam deflection.

Mask units 100 with great variations of the local structure density p are necessary in particular in the case of eDRAM logic units or transitions from the chip region to the periphery of the mask unit. In this case, the positioning accuracies in the case of the electron beam writing of photolithographic mask units 100 are substantially influenced by systematic effects.

In this case, an electrostatic charging in accordance with equations (1) to (3) above occurs as a mechanism of action, with electrostatic charging effects being amplified in the case of a deposition of electrons in the material of the mask unit. In a region with a high structure density of the mask unit, many electrons are deposited, i.e. there is an increased charge deposition in such a way that a stronger electric field forms than in regions having a lower structure density p.

Due to this electrostatic field, there results, in accordance with equations (4) to (7) above, a repulsion of the electron beam and thus a deviation $s_{x,y}$.

The deflection of the electrons as determined in accordance with equation (5) is thus effected from Newton's equations of motion. Such systematic effects are typically location-dependent so that, according to the invention, the entire area of the mask unit is subdivided into grid network parts of a grid, also referred to below as "patches".

The size of such patches is chosen to be smaller than the range of the charging effects δ, as explained above with reference to equations (8) to (14). The positioning accuracy in a patch can only be determined by a respective value in the x or y direction and is oriented to the center of the patches, as explained with reference to equation (17).

The description of the systematic effects through the use of a grid or through the use of patches takes a change in the electric field during the electron beam writing into account. The correction table obtained above with reference to equation (16) provides a correction of the positioning accuracies in that the correction table of the positional displacements in the x or y direction in each patch is either applied directly to the electron writing unit as a correction value, i.e. a value with an opposite sign, or in that corresponding correction values, i.e. structure displacements, are performed as early as during the processing of the design data.

The method according to the invention yields an exact model which permits the determination of the positioning inaccuracies without having to fabricate a test mask for measuring such charging effects.

The method in accordance with the exemplary embodiment is suitable for correcting all of the systematic effects in the photolithographic fabrication of a mask unit 100.

FIG. 2 shows a block diagram of a lithography apparatus for mask units 100 in accordance with a preferred exemplary embodiment of the present invention. The positional displacements $s_{x,y}$ of the mask unit 100, as is described above with reference to FIG. 1 and equations (1) to (17), can be corrected through the use of the apparatus illustrated in FIG. 2.

An electron beam device 201 provides an electron beam 301 from an output. The device 201 can also be an ion beam device providing an ion beam 301.

An electron beam writing unit 203 serves for deflecting the electron beam 301 in x and y directions and for writing a mask unit 100. In this case, it shall be assumed that the electron beam propagates in the z direction and the mask unit 100 lies in the x, y plane.

The electron beam writing unit 203 furthermore has a control unit 206, to which mask production data 302 can be fed, in order to correspondingly control the electron beam 301 and to produce a desired structure density p on the mask unit 100.

A mask data production unit 202 provides the mask production data 302, which are fed to the control unit 206. Since the electron beam 301, as is indicated by the dashed line (e⁻), is deflected by electrostatic charging effects, a mask unit 100 produced through the use of the mask production data 302 has displacements $s_{x,y}$. The displacements $s_{x,y}$ are corrected through the use of the method according to the invention for detecting and compensating for positional displacements $s_{x,y}$.

This method is explained above with reference to equations (1) to (17) and illustrated in the flow diagram of FIG. 1. The determination of an electron beam deflection brought about on the mask unit 100 in dependence on the structure density p of the mask unit 100 is provided by a determining device 204, which takes into account the electrostatic potential in accordance with the above equations.

The result of the determination is output by the determining unit 204 and fed to a correction device 205, which processes correction tables $m_{x,y}^{(i)}$ in accordance with equations (1) to (17) specified above. In accordance with equations (1) to (17) specified above, the correction tables $m_{x,y}^{(i)}$ processed by the correction device 205 for the correction of the mask production data 302, result in corrected mask production data 303. The corrected mask production data 303 are fed through an output device 207 either to an output terminal 208 or to the control unit 206 of the electron beam writing unit 203.

If the corrected mask production data 303 are output through the output terminal 208, there is the possibility of processing these data further and of using them, for example, as correction data for design data during data conditioning. This is done in such a way that positioning inaccuracies are already taken into account before production of a mask unit.

Furthermore, there is the possibility of feeding the corrected mask production data 303 directly to the control unit 206 of the electron beam writing unit 203. As a result thereof, depending on the type of a control loop, the corrected mask production data 303 can be used directly for correcting the mask production data 302 provided by the mask data production unit 202.

It should be pointed out that the positional displacements $s_{x,y}$ are represented as a difference between measured positions in the x, y plane $x_i$, $y_i$ and desired data of the x, y plane $x_i$, $y_i$. Crosses, for example, are used as reference points for the determination of the lithographic positional accuracy.

FIG. 3 shows an example of a mask unit 100, which is subdivided into a grid 101 with grid network parts 102, in accordance with a preferred exemplary embodiment of the present invention.

A typical mask unit 100 has dimensions of 15 cm×15 cm. The mask unit includes a glass carrier typically with a chromium coating and a chip pattern region on the mask unit having dimensions smaller than 10×10 cm² to 12×12 cm².

Typically 6×2 chips or electronic circuit units are represented on this mask unit 100. The method according to the invention corrects positional effects in the region of approximately 40 nm and less. On a mask unit 100, usually up to 150–200 reference points (crosses) are defined for the determination of the positioning accuracy. In this case, a grid network part writing direction 104 may be oriented row by row, as illustrated by the dashed line in FIG. 3. The dark regions correspond to grid network parts 103 that have already been written.

As already mentioned above, the correction tables $m_{x,y}^{(i)}$ according to the invention are used in two different ways for detecting and compensating for positional displacements $s_{x,y}$ of the photolithographic mask unit 100. The mask unit (100) is produced by electron beam writing as follows:
(i) the electron beam writing unit 203 provides a direct positional correction in the case of electron beam writing; or
(ii) the correction data of the correction table are used for correcting the design data during data conditioning for the mask production data.

Figure 4:
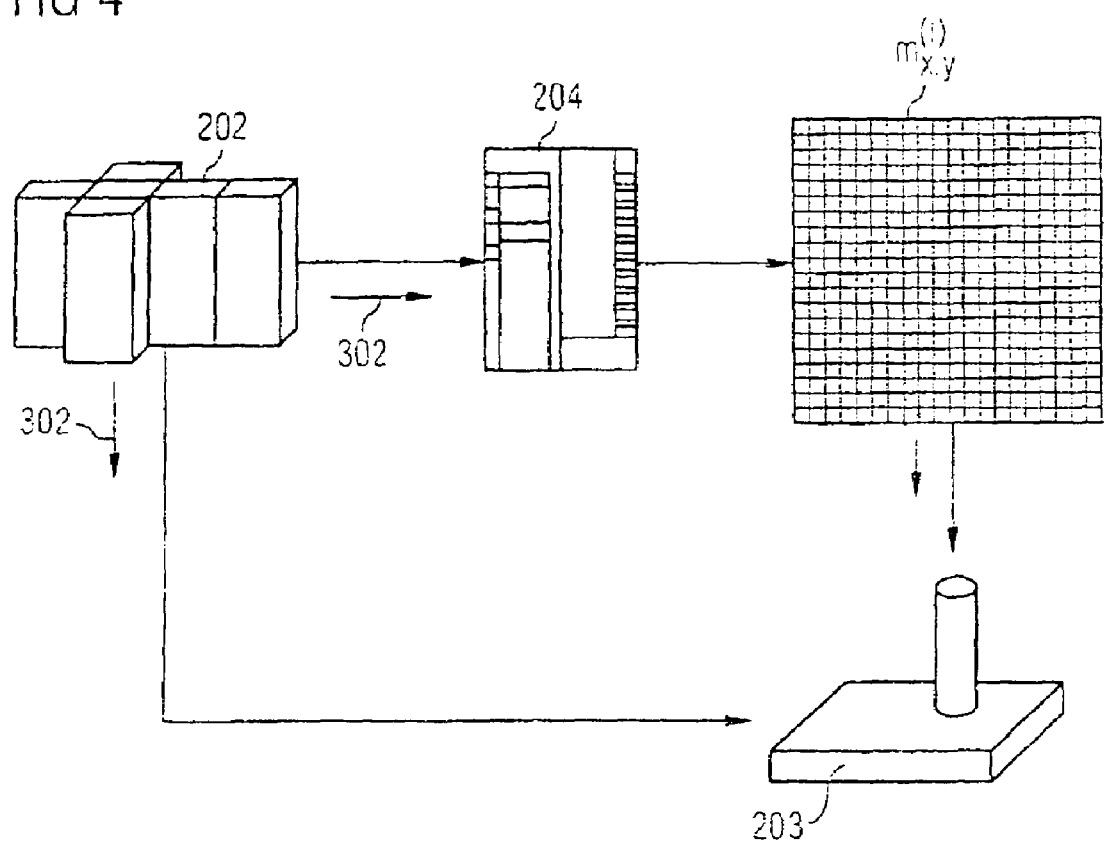
FIG. 4 is a perspective view illustrating the driving of an electron beam writing unit during electron beam writing for direct positional correction, in accordance with a preferred exemplary embodiment of the present invention.

FIG. 4 shows a block diagram illustrating the driving of an electron beam writing unit 203 in the case of electron beam writing for direct positional correction.

In this case, the mask production data 302 provided by the mask data production unit 202 are corrected with the aid of the correction tables $m_{x,y}^{(i)}$ directly during the electron beam writing. The corresponding correction tables $m_{x,y}^{(i)}$ are obtained with the aid of the determining device 204 using equations (1) to (17) specified above.

Figure 5:
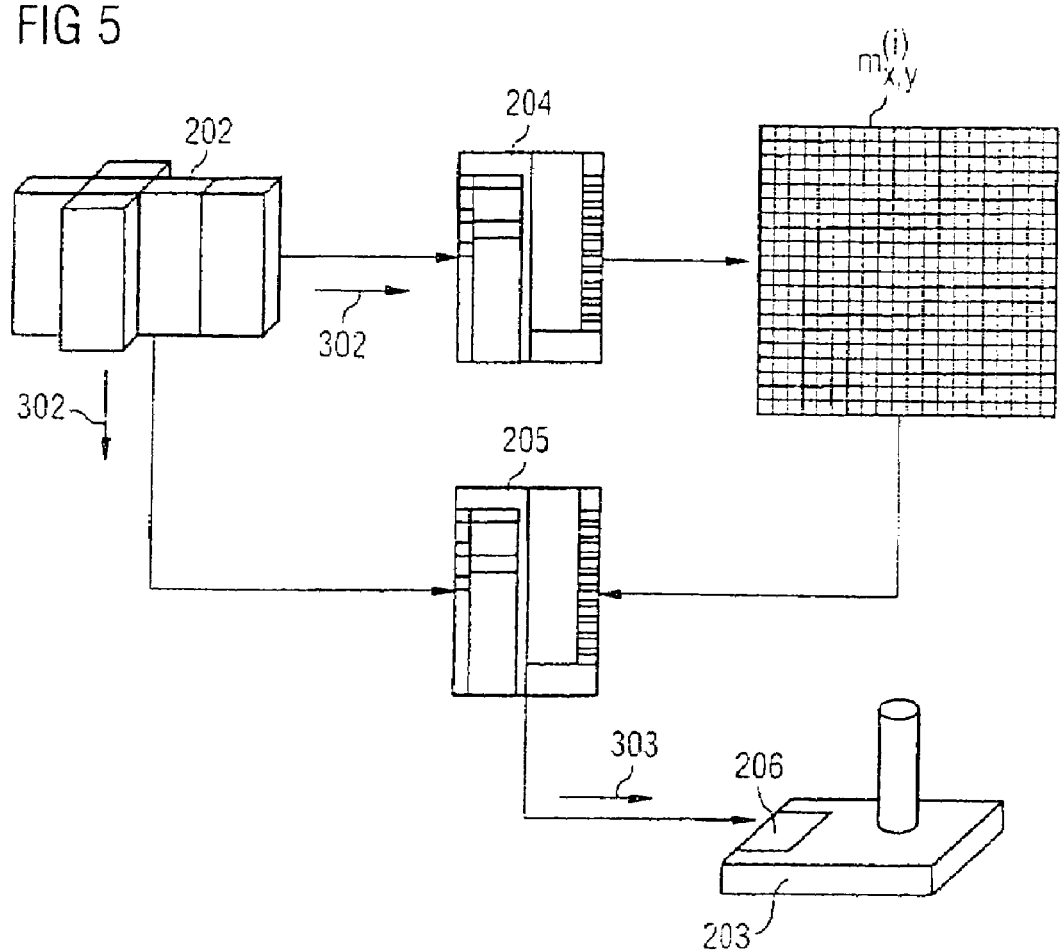
FIG. 5 is a view similar to FIG. 4 illustrating the driving of an electron beam writing unit during electron beam writing for the correction of design data during data conditioning for mask production data, in accordance with a further preferred exemplary embodiment of the present invention.

FIG. 5 shows a further block diagram illustrating the driving of an electron beam writing unit 203 in the case of electron beam writing for the correction of the design data during data conditioning for the mask production data 302.

In contrast to the configuration illustrated in FIG. 4, in the exemplary embodiment in accordance with FIG. 5, a correction device 205 is provided, which processes correction tables $m_{x,y}^{(i)}$ in accordance with equations (1) to (17) specified above. The correction tables $m_{x,y}^{(i)}$ processed by the correction device 205 for the correction of the mask production data 302 result, in accordance with equations (1) to (17) specified above, in corrected mask production data 303. As explained above with reference to FIG. 2, the corrected mask production data 303 are fed through an output device 207 either to an output terminal 208 or to the control unit 206 of the electron beam writing unit 203.

Although the present invention has been explained above with reference to electron beam writing, it is clear to the person skilled in the art that, when the charge signs and the quantity of charge are correspondingly taken into account, the method according to the invention is also suitable for ion beam writing with the aid of ion beam writing units.

Although the present invention has been described above on the basis of preferred exemplary embodiments, it is not restricted thereto, but rather can be modified in diverse ways.

Moreover, the invention is not restricted to the application possibilities mentioned.

This application claims the priority, under 35 U.S.C. § 119, of German Patent Application 103 19 370.7, filed Apr. 29, 2003; the entire disclosure of the prior application is herewith incorporated by reference.

We claim:

1. A method for detecting and compensating for positional displacements of a photolithographic mask unit produced by electron beam writing, which comprises the following steps:
    a) providing mask production data for the writing of the mask unit with an electron beam;
    b) inputting a structure density of the mask unit;
    c) determining, by a grid having grid network parts, an electron beam deflection brought about on the mask unit in dependence on the structure density of the mask unit, the grid being provided with a grid network size selected to be smaller than a lateral range of the electron beam deflection;
    d) correcting the mask production data with the determined electron beam deflection, to obtain corrected mask production data; and
    e) outputting the corrected mask production data.

2. The method according to claim 1, wherein the electron beam deflection is brought about by systematic effects.

3. The method according to claim 1, wherein the electron beam deflection is brought about by electrical potentials formed by attachment of electrons at structures of the mask unit.

4. The method according to claim 3, wherein the electrical potentials formed by the attachment of electrons at structures of the mask unit are determined by a convolution.

5. The method according to claim 1, wherein the determination of the electron beam deflection by a grid is provided on the basis of Newton's equations of motion.

6. The method according to claim 1, wherein the corrected mask production data are provided, in the form of a correction table.

7. A method for detecting and compensating for positional displacements of a photolithographic mask unit produced by ion beam writing, which comprises the following steps:
    a) providing mask production data for the writing of the mask unit with an ion beam;
    b) inputting a structure density of the mask unit;
    c) determining, by a grid having grid network parts, an ion beam deflection brought about on the mask unit in dependence on the structure density of the mask unit, the grid being provided with a grid network size selected to be smaller than a lateral range of the ion beam deflection;
    d) correcting the mask production data with the determined ion beam deflection, to obtain corrected mask production data; and
    e) outputting the corrected mask production data.

8. A lithography apparatus for mask units permitting correction of positional displacements of a mask unit, the apparatus comprising:
    a) an electron beam device for outputting an electron beam;
    b) a mask data production device for providing mask production data corresponding to a mask unit to be produced;
    c) an electron beam writing unit for writing a mask unit with the electron beam in dependence on the mask production data provided;
    d) a determining device for determining, by a grid having grid network parts, an electron beam deflection brought about on the mask unit, in dependence on a structure density of the mask unit, the grid being provided with a grid network size selected to be smaller than a lateral range of the electron beam deflection;
    e) a correction device for correcting the mask production data with the determined electron beam deflection, to obtain corrected mask production data; and
    f) an outputting device for outputting the corrected mask production data.

9. The apparatus according to claim 8, wherein said electron beam writing unit has a control unit for controlling the electron beam in dependence on the corrected mask production data.

10. A lithography apparatus for mask units permitting correction of positional displacements of a mask unit, the apparatus comprising:

a) an ion beam device for outputting an ion beam;
b) a mask data production device for providing mask production data corresponding to a mask unit to be produced;
c) an ion beam writing unit for writing a mask unit with the ion beam in dependence on the mask production data provided;
d) a determining device for determining, by a grid having grid network parts, an ion bean deflection brought about on the mask unit, in dependence on a structure density of the mask unit, the grid being provided with a grid network size selected to be smaller than a lateral range of the ion beam deflection;
e) a correction device for correcting the mask production data with the determined ion beam deflection, to obtain corrected mask production data; and
f) an outputting device for outputting the corrected mask production data.

* * * * *